(12) United States Patent
Hozoji et al.

(10) Patent No.: US 7,589,400 B2
(45) Date of Patent: Sep. 15, 2009

(54) INVERTER AND VEHICLE DRIVE UNIT USING THE SAME

(75) Inventors: Hiroshi Hozoji, Hitachiota (JP); Toshiaki Morita, Hitachi (JP); Satoru Shigeta, Hitachinaka (JP); Tokihito Suwa, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/206,166

(22) Filed: Aug. 18, 2005

(65) Prior Publication Data

US 2006/0071860 A1 Apr. 6, 2006

(30) Foreign Application Priority Data

Oct. 4, 2004 (JP) .............................. 2004-291002

(51) Int. Cl.
*H01L 23/495* (2006.01)
*H01L 23/48* (2006.01)

(52) U.S. Cl. ...................... 257/673; 257/691; 257/692; 257/737; 257/723; 257/E23.047

(58) Field of Classification Search ................ 257/692, 257/690, 779, 691, 673, 737, 723, E23.047
See application file for complete search history.

(56) References Cited

U.S. PATENT DOCUMENTS

| | | | |
|---|---|---|---|
| 5,504,378 A | 4/1996 | Lindberg et al. | |
| 5,523,620 A * | 6/1996 | Eytcheson et al. | 257/690 |
| 5,539,254 A * | 7/1996 | Eytcheson et al. | 257/691 |
| 6,127,727 A | 10/2000 | Eytcheson | |
| 6,528,880 B1 | 3/2003 | Planey | |
| 6,677,677 B2 * | 1/2004 | Kimura et al. | 257/737 |
| 6,933,593 B2 * | 8/2005 | Fissore et al. | 257/675 |
| 2002/0006685 A1 | 1/2002 | Petitbon et al. | |
| 2002/0195286 A1 | 12/2002 | Shirakawa et al. | |

FOREIGN PATENT DOCUMENTS

| | | |
|---|---|---|
| EP | 1376696 A1 | 1/2004 |
| JP | 2001-258267 | 9/2001 |
| JP | 2002-369550 | 12/2002 |
| JP | 2003-197859 | 7/2003 |

OTHER PUBLICATIONS

European Search Report dated Feb. 16, 2006 (nine (9) pages).

* cited by examiner

*Primary Examiner*—Nitin Parekh
(74) *Attorney, Agent, or Firm*—Crowell & Moring LLP

(57) ABSTRACT

The inverter has a plurality of arms for conducting or cutting off a current and each arm has a switching device and a first and a second wiring layer for connecting the switching device. The first and second wiring layers of each arm are respectively formed on insulating substrates, and one face of the switching device is fixed to the first wiring layer, and the second wiring layer and the other face of the switching device are electrically connected by a laminal conductor, and the laminal conductor has a first and a second connection, and the first connection of the laminal conductor is fixed to the other face of the switching device, and the second connection of the laminal conductor is fixed to the second wiring layer.

Thereby, a large current of the inverter can be realized and the assembly capacity of the inverter or the vehicle drive unit will be improved.

4 Claims, 11 Drawing Sheets

INVERTER AND VEHICLE DRIVE UNIT USING THE SAME

CLAIM OF PRIORITY

The present application claims priority from Japanese application serial no. 2004-291002, filed on Oct. 4, 2004, the content of which is hereby incorporated by reference into this application.

FIELD OF THE INVENTION

The present invention relates to an inverter and a vehicle drive unit using it.

BACKGROUND OF THE INVENTION

Conventionally, in an electric car driven only by a motor and a hybrid electric car driven by both an engine and a motor, a direct current supplied from a DC power source is converted to an alternating current supplied to a vehicle drive motor by an inverter. The inverter, for example, as described in Japanese Patent Laid-Open No. 2001-258267 and Japanese Patent Laid-Open No. 2002-369550, is composed of a semiconductor apparatus called a power module or an inverter bridge circuit and a control substrate loading electronic parts such as a capacitor, a drive circuit, an interface circuit, a sensor circuit, a calculator, and a control power source.

The power module has a switching device composed of an IGBT and an MOSFET attached onto an insulating substrate. Between the surface electrode of the switching device and the wiring terminal fixed to an external case for storing the power module, bonding aluminum wires are connected.

SUMMARY OF THE INVENTION

With respect of the bonding wires for connecting the switching device, to prevent the wires from fusion due to generation of heat by a current when the current amount controlled by the switching device is increased, it is necessary to increase the number of wires to be used for connection or increase the diameter of each wire.

Concretely illustrated, for example, when the current controlled by the inverter is assumed as 150 A and aluminum wires are used as bonding wires, if the allowable current of the aluminum bonding wires with a diameter of 300 μm is assumed as 10 A, it is necessary to use at least 15 bonding wires. The wires illustrated here are thicker than wires generally used and a problem arises that the time required for bonding of each wire is long. Further, the number of wires to be used is increased, thus the work time thereof becomes longer. The time is explained above as an example, though not only in respect of time but also in respect of necessary machinery and technology, a big problem is imposed in the workability.

Further, when bonding wires used are thickened and the time required for bonding is prolonged, the damage caused to the switching device during bonding is increased and a problem arises that the reliability is lowered.

An object of the present invention is to improve the assembly capacity of an inverter or a vehicle drive unit.

The present invention, to accomplish the above object, is structured so as to fix one electrode of a semiconductor switching device used in an inverter to a first wiring layer and connect the other electrode of the switching device to a second wiring layer composed of a laminal conductor.

By use of such a constitution, the laminal conductor flowing a large current is connected to the electrode of the semiconductor device, thus they can be connected electrically, and compared with use of wire bonding, the assembly capacity is improved, and the reliability of the inverter is also improved.

According to the present invention, a large current can be realized and the assembly capacity can be improved.

DESCRIPTION OF THE PREFERRED EMBODIMENTS

Figure 1:
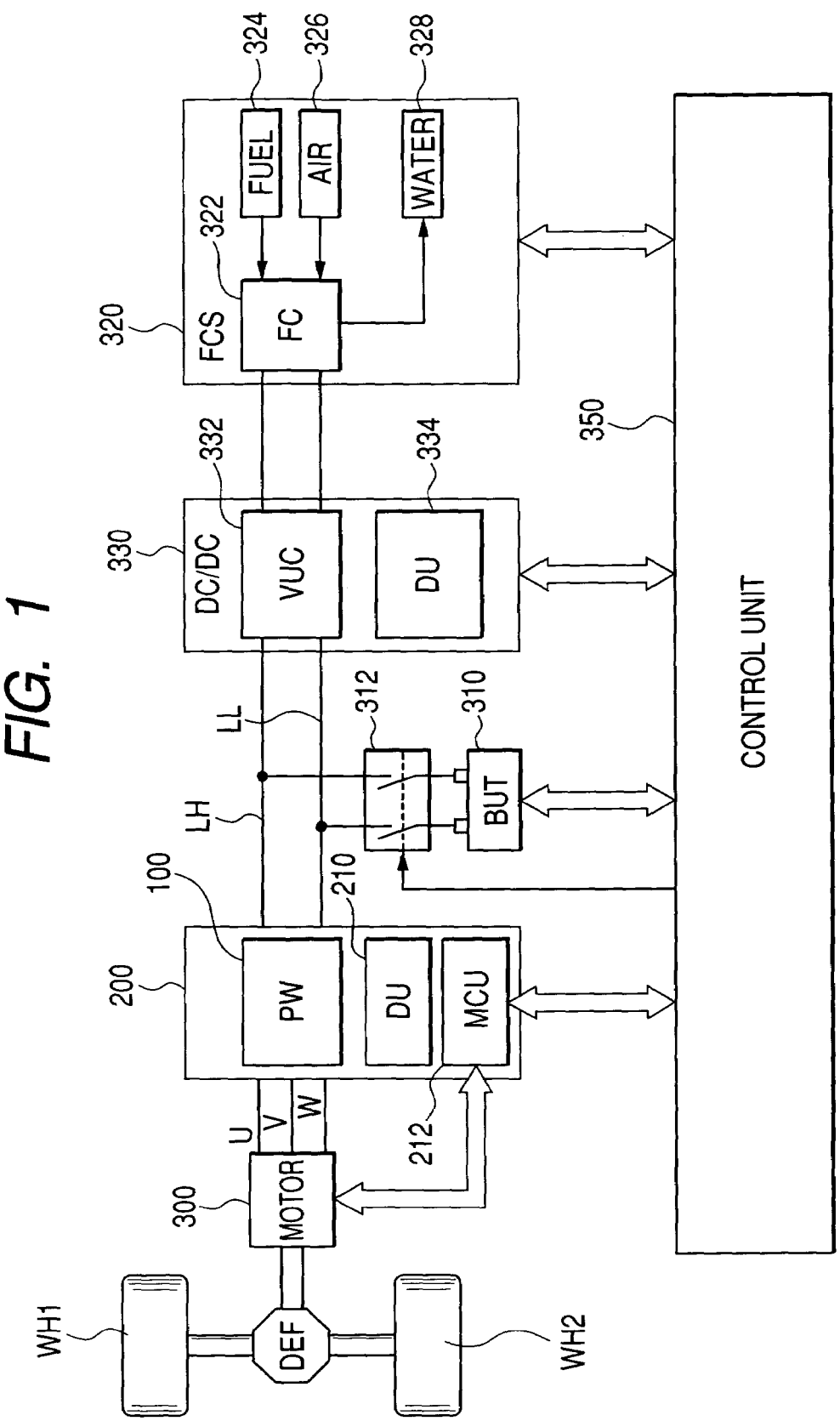
FIG. 1 is a system block diagram showing the schematic constitution of the drive system including a vehicle drive unit using the power module of the first embodiment of the present invention.

FIG. 1 shows a drive system including a vehicle drive unit and concretely an electric car drive system. This embodiment uses an electric car using a fuel cell, though an inverter which will be explained hereunder can be used for an electric car of the so-called hybrid type whose wheels are driven by output of an engine and a motor. Further, when the numerals used in FIG. 1 are the same as those shown in other drawings, they indicate the same parts.

An inverter 200 converts direct currents supplied from a DC-DC converter 330 and a battery 310 to alternating currents and supplies the alternating currents to a motor 300 which is a rotating machine. The motor 300 is shown as an example of a car motor, for example, a synchronous motor 300. The motor 300, in this embodiment, has a permanent magnet in a rotor, generates a rotating magnetic field by the supplied alternating current, rotates the rotor, and generates torque for traveling of the car. The output torque of the motor 300 is transferred to left and right wheels WH1 and WH2 via a differential gear DEF which is a power distribution mechanism. The power supplied to the inverter is produced by a fuel cell system (FCS) 320. Further, in the hybrid type electric car aforementioned, in place of the fuel cell system (FCS), the concerned power is supplied from a secondary battery for storing power supplied from a generator driven by the engine. In the hybrid type electric car, the vehicle travels by output of both engine and motor 300.

The fuel cell system (FCS) 320 is composed of a fuel cell (FC) 322, a tank 324 for storing fuel such as hydrogen, a mechanism 326 for taking in air, and a drainage tank 328 for storing water. The fuel tank 324 stores pressurized gaseous hydrogen and by a control signal from a control unit 350, the fuel amount supplied from the fuel tank 324 to the fuel cell 322 is controlled. Further, air including oxygen for reacting with fuel is taken in from the air take-in mechanism 326 and is supplied to the fuel cell (FC) 322.

The fuel cell 322 has a reaction film, a fuel pole, and an air pole and generates a DC voltage on the basis of hydrogen from the fuel tank 324 and oxygen supplied from the air take-in mechanism 326, and water is produced as a result of reaction of hydrogen and oxygen. Hydrogen molecules are ionized by the fuel cell 322, thus the fuel pole of the fuel cell is changed to negative potential, and hydrogen ions positively charged are collected at the air pole of the fuel cell 322, and the air pole is changed to positive potential. A current is supplied from the fuel cell system 320 to an external electric load, thus a current is supplied from the fuel cell to the air pole via an external circuit such as the aforementioned load, and electrons are supplied. The air pole is supplied with oxygen and when electrons are supplied to the air pole from the external circuit, in the air pole, hydrogen ions and oxygen are reacted to produce water. The water is stored in the drainage tank 328. As fuel aforementioned, in addition to hydrogen, methanol, gasoline, and natural gas can be used.

The power amount generated by the fuel cell system 320 almost depends on the fuel amount supplied to the fuel cell 322, that is, the hydrogen amount. The control unit 350 detects the load condition of the fuel cell system 320 by a sensor, not drawn, for detecting the stepping depth on the accelerator and controls the fuel supply amount supplied to the fuel cell 322 on the basis of the load condition. The load condition aforementioned, for example, can be detected by detecting the output terminal voltage of the fuel cell system 320 and for example, so as to increase the output terminal voltage to a target voltage, the fuel supply amount may be feedback-controlled.

Power may be supplied from the fuel cell system 320 directly to the battery 310 or a voltage may be converted to an appropriate value via the DC-DC converter 330 which is a DC voltage converter and supplied to the battery 310. This embodiment indicates a method of converting to an appropriate voltage by the DC-DC converter 330 and storing it in the battery.

The battery 310 is connected to the DC power source line via a switch 312. The terminal voltage of the battery 310 is, for example, 300 V, and a DC voltage of 300 V is supplied to an inverter 200, and it is converted to a three-phase alternating current and is supplied to the motor 300 via supply lines U, V, and W.

The rated voltage of the battery 310 is, for example, 300 V and the rated voltage of the fuel cell 320 is 24 V to 96 V, for example, 48 V. In this case, the output voltage of the fuel cell 320 is increased by the voltage increase type DC-DC converter 330 and is supplied to and charged by the battery 310. However, the rated voltage can be set variously and for example, the rate voltages of the inverter 200 and battery 310 may be set to 600 V and the output voltage of the fuel cell system 320 may be set to 300 V. Further, as another example, it is possible to generate a voltage of about 400 V by the fuel cell, lower the voltage by the DC-DC converter 330, and supply a rated voltage of 300 V to the inverter 200 and the battery 310.

To the motor 300, power is supplied from the battery 310 via the inverter 200. The inverter 200 is composed of a motor control unit MCU 212, a power module 100 which will be explained below, and a drive circuit unit 210 for generating a gate signal for driving a semiconductor switching device constituting the power module 100. The control unit 350 receives the vehicle accelerator operation amount generated by a sensor, not drawn, for detecting the accelerator operation amount as input information, calculates target torque generated by the motor 300 on the basis of the accelerator operation amount, and transmits it to the motor control unit 212 as a motor torque instruction. The motor control unit 212, on the basis of the torque instruction generated by the motor, controls generation of a gate signal generated by the drive circuit unit 210.

The inverter has a plurality of arms in the power module 100, and continuity and non-continuity of the arms are controlled by the gate signal, and the inverter supplies a three-phase AC current generated on the basis of the gate signal to the motor 300. More in detail, the motor control unit 212 receives the rotor position of the motor, current flowing through the motor, and motor temperature as input information and executes control in consideration of maintenance of the safety of the motor.

Furthermore, the temperature and current of the motor are sent to the control unit 350 which is a host control unit. When the vehicle is a hybrid car, the control unit 350 calculates torque necessary for traveling of the vehicle from the information such as the accelerator operation amount, calculates how the calculated necessary torque is allotted to the engine and motor, and obtains the allotted torque of the motor. The control unit 350 sends the allotted torque of the motor to the motor control unit 212 as a torque instruction value. As mentioned above, the motor control unit 212 controls the drive circuit unit 210 and controls generation of the gate signal of the semiconductor switching device of the power module 100, and the motor generates the allotted torque of the motor.

The DC-DC converter 330 functions so as to increase or drop the input DC voltage and is composed of a converter circuit 332 having a semiconductor switching device for cutting off periodically the current and to control the switching device of the converter circuit 332, a drive circuit unit 334 for generating a control signal supplied to the gate of the switching device.

The control unit 350, moreover, detects the charging and discharging condition of the battery and the load condition of the motor, controls the DC-DC converter 330 on the basis of the detection results, controls the charging of the battery 310, and controls the supply voltage to the motor. When a large amount of current is to be supplied to the motor 300, in addition to the current from the battery 310, a current is supplied from the fuel cell system 320 via the DC-DC converter 330. Further, when the vehicle is in the low speed traveling state, that is, the rotational speed of the motor 300 is low, the internal induced voltage of the motor 300 is low, so that a large current can be supplied. In this case, the DC-DC converter 330 outputs a voltage corresponding to the rated voltage of the battery 310. The state that the vehicle speed is fast is the state that the rotational speed of the motor 300 is fast and the internal induced voltage of the motor is increased. To suppress an increase in the induced voltage, weak field control is generally executed. Nevertheless, the increase in the induced voltage cannot be suppressed and it is difficult to supply a necessary current to the motor. To correspond to increasing of the internal induced voltage, it is desirable to increase the supply voltage supplied to the motor. When the motor 300 is in the high rotational speed state, so as to increase the output voltage of the DC-DC converter 330, the control unit 350 controls the DC-DC converter 330, opens the switch 312 between the terminal of the battery 310 and the input terminal of the inverter 300, and controls so as to separate the battery 310 from the DC power supply line of the inverter. By doing this, the input voltage supplied to the motor can be increased, and even if the internal induced voltage of the motor is increased, power can be supplied at a voltage higher than it, and a reduction phenomenon of the current supply amount to the motor can be suppressed.

Figure 2:
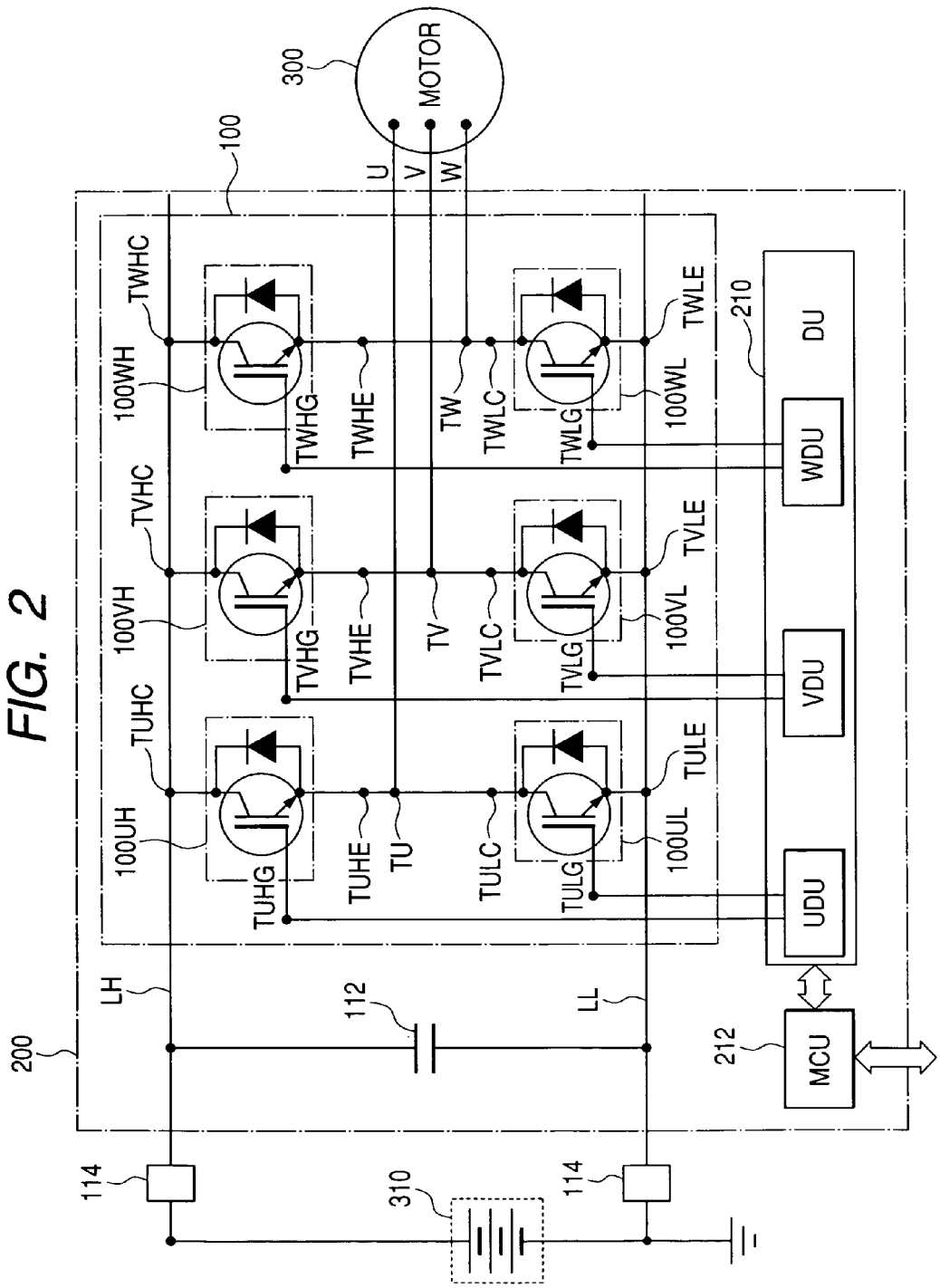
FIG. 2 is a circuit diagram of the inverter including the power module of the first embodiment of the present invention.

FIG. 2 is a circuit diagram of the inverter 200 shown in FIG. 1. The power module 100 of the inverter 200 is composed of six arms, converts a direct current supplied from the battery 310 which is a car DC power source to an alternating current, and supplies power to the motor 300 which is a rotating machine. Further, in this embodiment, the motor 300 is a synchronous motor having a permanent magnet in the rotor. The six arms of the power module are an upper arm 100UH of U-phase, a lower arm 100UL of U-phase, an upper arm 100VH of V-phase, a lower arm 100VL of V-phase, an upper arm 100WH of W-phase, and a lower arm 100WL of W-phase. Further, in the embodiment shown in FIG. 2, each arm of each phase uses an IGBT (insulated gate bipolar transistor) as a semiconductor switching device. As a semiconductor switching device, in addition to the IGBT, a power MOS-FET (metal oxide semiconductor-field effect transistor) can be used.

The IGBT has an advantage of a fast operation speed. In old times, the voltage at which a power MOS-FET can be used is low, so that a high-voltage inverter is made of an IGBT. However, in recent years, the voltage at which a power MOS-FET can be used has been increased, thus for a vehicle inverter, both transistors can be used as a semiconductor switching device. When a power MOS-FET is used, the semiconductor structure is simpler than that of an IGBT and there is an advantage that the number of semiconductor manufacturing processes is smaller than that of the IGBT.

In FIG. 2, the upper arm and lower arm of each of the phases U, V, and W are connected in series. The respective collector terminals (drain terminals when a power MOS-FET is used) of the upper arms 100UH, 100VH, and 100WH of the phases U, V, and W are connected to the wire LH on the positive pole side of the DC power source. On the other hand, the respective emitter terminals (source terminals when a power MOS-FET is used) of the lower arms 100UL, 100VL, and 100WL of the phases U, V, and W are connected to the wire LL on the negative pole side of the DC power source. Between the wires LH and LL, as explained in FIG. 1, a DC power source such as the battery 310 loaded in a vehicle or the DC-DC converter 330 which is a voltage converter is connected and a DC voltage is supplied to the power module 100 of the inverter.

The connection point of the emitter terminal (source terminal when a power MOS-FET is used) of the upper arm 100UH of the phase U and the collector terminal (drain terminal when a power MOS-FET is used) of the lower arm 100UL of the phase U is connected to the phase U terminal of the motor and a phase U current flows. When the armature winding (stator winding of the permanent magnet type synchronous motor) is Y-connection, a current of the phase U winding flows. The connection point of the emitter terminal (source terminal when a power MOS-FET is used) of the upper arm 100VH of the phase V and the collector terminal (drain terminal when a power MOS-FET is used) of the lower arm 100VL of the phase V is connected to the phase V terminal of the armature winding (stator winding) of the phase V of the motor and a phase V current flows. When the stator winding is Y-connection, a current of the phase V winding flows. The connection point of the emitter terminal (source terminal when a power MOS-FET is used) of the upper arm 100WH of the phase W and the collector terminal (drain terminal when a power MOS-FET is used) of the lower arm 100WL of the phase W is connected to the phase W terminal of the motor. When the stator winding is Y-connection, a current of the phase W winding flows.

In FIG. 2, to the power module 100, as described above, the DC voltage is applied from the DC power source such as the battery 310 via the positive pole side wire LH and the negative pole side wire LL. Respectively on the positive pole side wire LH and negative pole side wire LL, in the mounting circuit, there is an inductance 114 installed. Further, between the positive pole side wire LH and the negative pole side wire LL, a capacitor 112 is installed and by the capacitor 112 and the inductance 114, removal of noise and voltage variations generated by the power module 100 are prevented from affecting other devices via the power source lines.

The driver unit 210 generating a gate signal is controlled by the motor control unit 212 and the gate signal is supplied from driver units UDU, VDU, and WDU of each phase to the semiconductor switching device of each layer. By the gate signal, the continuity and non-continuity (cutting off) of each arm are controlled. As a result, the supplied direct current is converted to a three-phase alternating current. The generation of the three-phase alternating current is known already, so that detailed operation explanation will be omitted.

Figure 3:
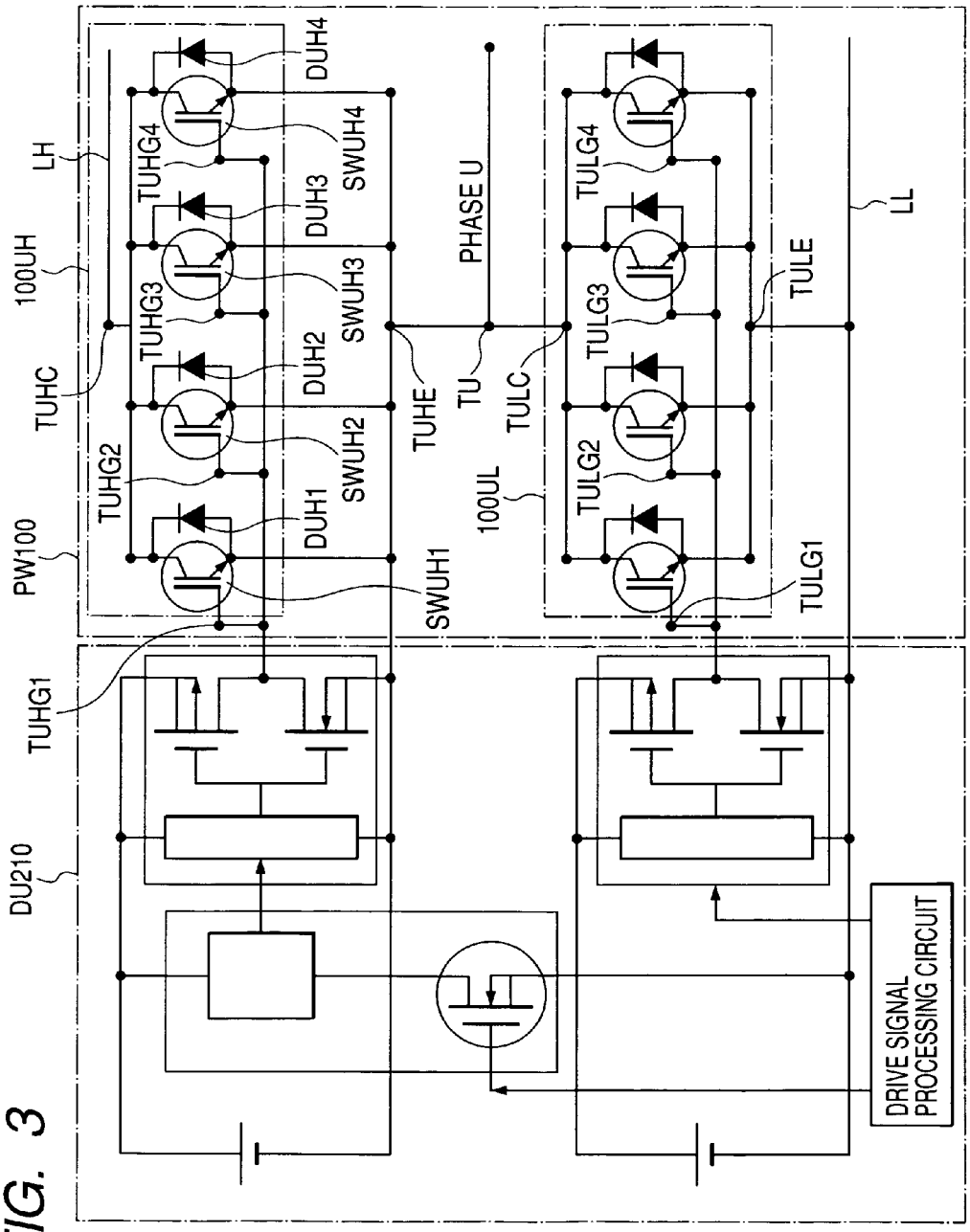
FIG. 3 is a detailed circuit diagram of the inverter including the power module of the first embodiment of the present invention.

The semiconductor switching devices constituting the arms 100UH, 100UL, 100VH, 100VL, 100WH, and 100WL of the inverter are respectively composed of a plurality of switching devices connected in parallel. The situation is shown in FIG. 3. FIG. 3 shows the arms 100UH and 100UL in detail. In the respective arms, as represented by the arm 100UH, a plurality of circuits composed of a switching device SWUH1 like an IGBT and a diode DUH1 connected to it in parallel, 4 sets in this embodiment, are connected in parallel. Namely, 4 sets of switching circuits of the switching circuit composed of the switching device SWUH1 and diode DUH1, a switching circuit composed of a switching device SWUH2 and a diode DUH2, a switching circuit composed of a switching device SWUH3 and a diode DUH3, and a switching circuit composed of a switching device SWUH4 and a diode DUH4 are further connected in parallel. When a power MOS-FET is used in place of the IGBT, each power MOS-FET has already the diode function, so that the diodes DUH1 to DUH4 are not necessary.

FIG. 3 shows 4 sets of switching circuits installed in parallel, though the number of sets installed in parallel depends on the maximum supply current supplied to the motor. As described above, each arm constituting the inverter, in this embodiment, is composed of 4 sets of switching circuits. To each gate of the switching circuits, a gate control signal is supplied in parallel from the UDU of the driver unit 210. The similar circuit to that of the UDU of the driver unit 210 is installed in the VDU and WDU and the gate signal is supplied in parallel to each switching device constituting each switching circuit.

The reason that the respective switching devices are connected in parallel is not only to respond to the maximum current of the motor but also to improve the safety of a car. When mounting an IGBT or a power MOS-FET, prevention of damage due to the thermal cycling is a very important problem. A large cause of damage to the inverter circuit is that whenever the inverter circuit is operated, stress due to the thermal expansion occurs in the chip of the switching devices mounted and by repetition of it, damage is caused. As a result of the damage, the electrical continuity of the devices is impaired. In this embodiment, a plurality of devices are connected in parallel, so that even if an electrical continuity fault is caused in one of the devices, by an emergency measure of lowering the maximum torque of the motor, the car continue traveling to a repair shop or a neighboring town. Further, danger of sudden stop of generation of motor torque during high speed traveling can be avoided. When using a parallel circuit of a plurality of switching devices in place of one switching device capable of supplying a large current, although the number of parts increases and the operation amount in manufacture increases in correspondence to, it leads to a reduction in the danger in case of trouble.

Figure 4:
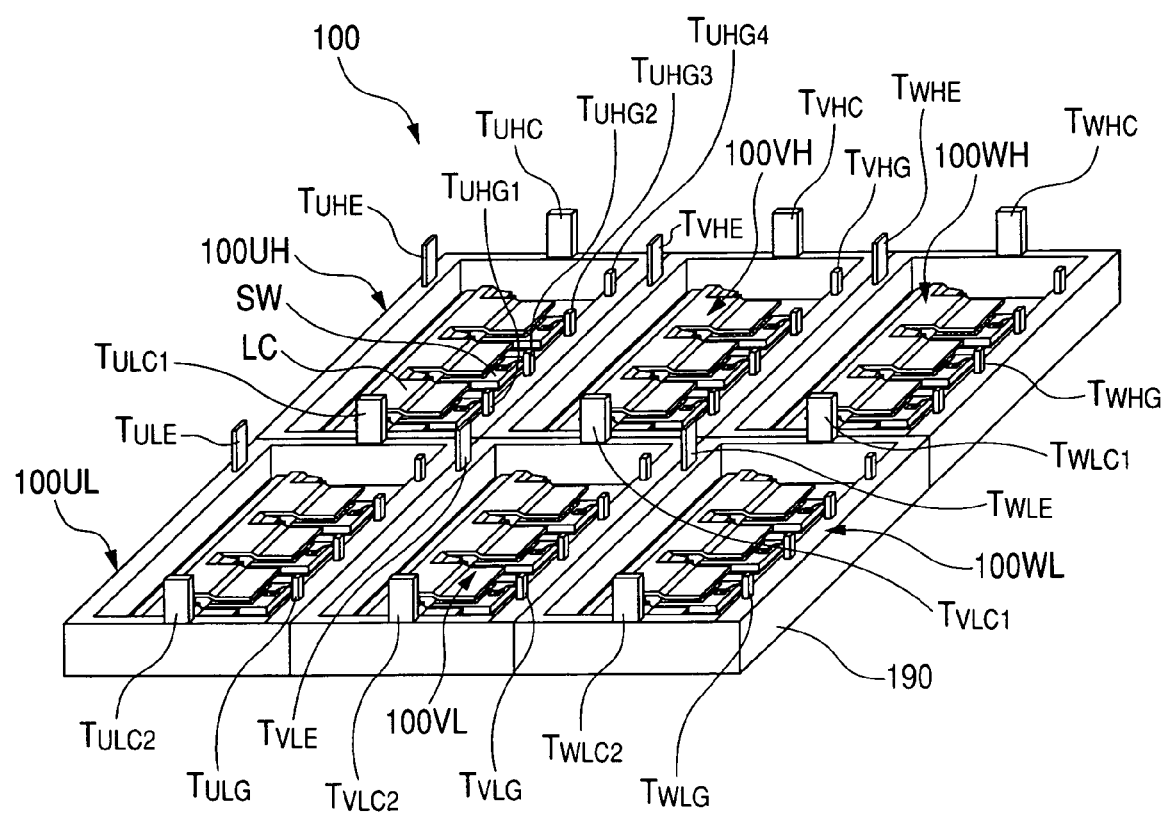
FIG. 4 is a perspective view showing the external constitution of the power module of the first embodiment of the present invention.
Figure 5:
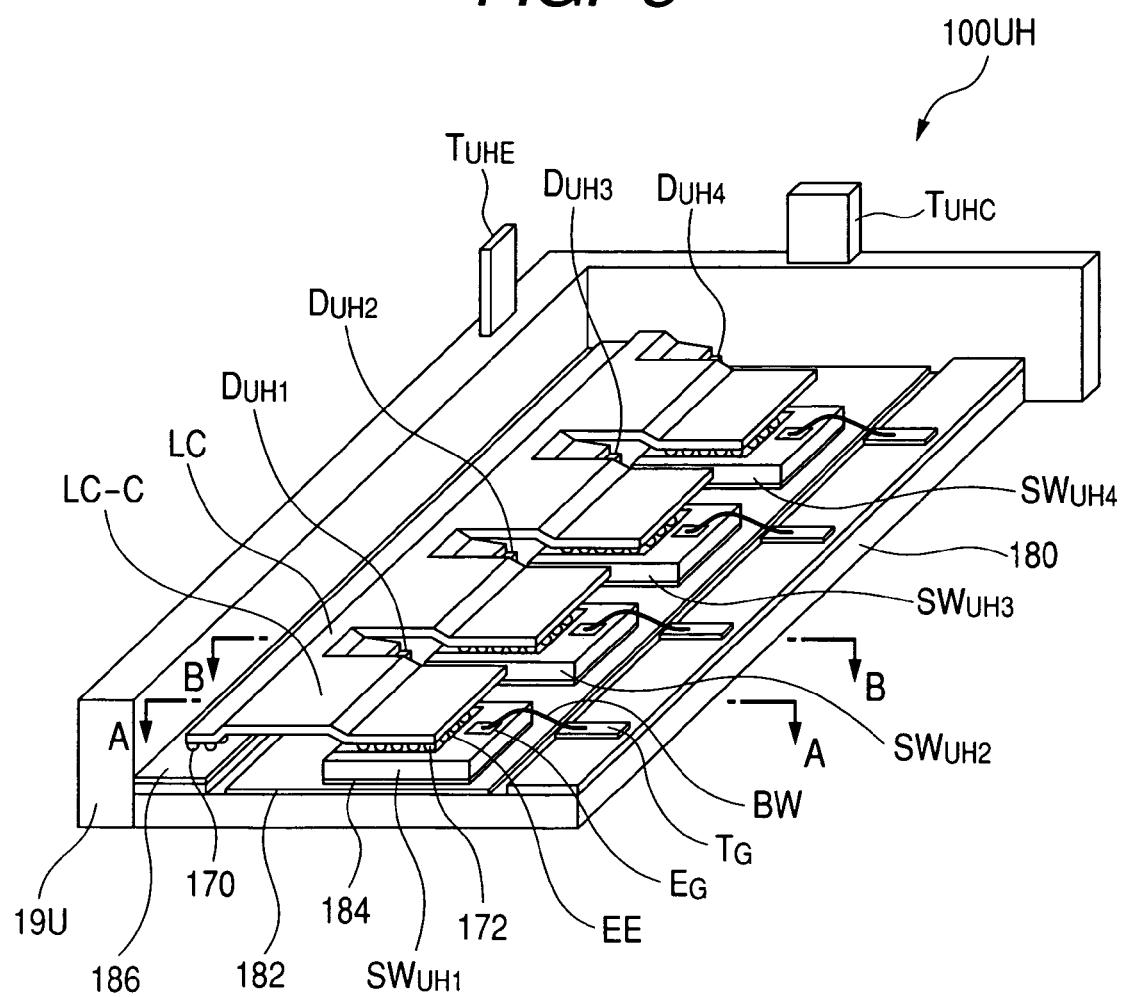
FIG. 5 is an enlarged perspective view showing the constitution of the arm module of the power module of the first embodiment of the present invention.

The mounting structure of the power module 100 shown in FIGS. 2 and 3 is shown in FIGS. 4 and 5. FIG. 4 is a perspective view showing the outline of the power module 100 and FIG. 5 is an enlarged view of the arm. In FIGS. 4 and 5, inside a frame 190 made of resin, the arms constituting the power module 100 of the inverter are arranged and collector terminals TUHC, TVHC, and TWHC of the upper arms of each of the phases U, V, and W, collector terminals TULC, TVLC, and TWLC of the lower arms of each phase, emitter terminals TUHE, TVHE, and TWHE of the upper arms of each phase, emitter terminals TULE, TVLE, and TWLE of the lower arms of each phase, gate terminals TUHG, TVHG, and TWHG of the upper arms of each phase, and gate terminals TULG, TVLG, and TWLG of the lower arms of each phase are installed on the side wall of the frame 190. Further, in this example, the arms 100UH, 100UL, 100VH, 100VL, 100WH, and 100WL are respectively composed of semiconductor switching devices SW of four IGBTs connected in parallel and diodes respectively connected to the semiconductor switching devices in parallel. The gate terminals TUHG, TVHG, and TWHG of the upper arms of each phase and the gate terminals TULG, TVLG, and TWLG of the lower arms of each phase have four gate terminals corresponding to the aforementioned four semiconductor switching devices connected in parallel. The upper arm 100UH will be explained as a representative example of the six arms.

In FIG. 4, the gate terminal TUHG of the upper arm of the phase U is composed of four gate terminals TUHG1, TUHG2, TUHG2, and TUHG2 corresponding to the semiconductor switching devices SW constituting the upper arm 100UH. Gates TVHG, TWHG, TULG, and TWLG of the other arms are similarly composed of four gate terminals respectively corresponding to the four semiconductor switching devices. The detailed structure will be described later by referring to FIG. 5. Further, the switching devices of each arm are electrically connected in parallel, so that when a structure of connecting the four gate terminals in the frame 190 is used, the overall structure of the inverter is simplified. However, to make a diagnosis of faults in each device, it is desirable to independently apply a gate signal to each device and diagnose the operation of the device. In this case, the gates are wired separately up to the circuit substrate to which the motor control unit 212 and the driver unit 210 are attached and whether to apply simultaneously the gate signals of the devices connected in parallel on the circuit substrate or apply separately is controlled. In this embodiment, the gate of each device is installed independently of the circuit substrate. In this respect, the explanation is omitted in FIG. 3 and the circuit is drawn conceptually so that the gate circuit is not separated to simplify the explanation. Actually, the output of the drive unit is further connected respectively via the switching circuit installed at each gate, and in the operation mode of the motor, the switches are conducted to each other, and in the test mode, only the switches to be tested are conducted, and the other switches are cut off.

The arms 100UH, 100VH, 100WH, 100UL, 100VL, and 100WL respectively have four semiconductor switching devices connected in parallel and the upper electrodes (in this example, IGBT emitter electrodes) of the four switching devices SW are connected by a lead-shaped conductor LC. As a lead-shaped conductor LC, for example, a thin-sheet shaped core material made of copper or aluminum whose surface is plated with nickel and gold, or a similar core material whose surface is plated with nickel and tin, or a core material compounded with copper and an alloy of iron and nickel which is plated with nickel and gold or tin can be used.

Further, as a lead-shaped conductor LC, for example, ceramics of aluminum nitride or silicon nitride connected with copper, or aluminum, or a composite material of copper and an alloy of iron and nickel which are plated with nickel and gold or tin can be used.

In FIGS. 4 and 5, the upper cover of the power module 100 is removed and the distributing board shown in FIG. 6 which will be described later is installed above it as a cover of the resin frame 190. In the power module 100, to prevent wire vibration during operation and effects of water and foreign substances which may be externally mixed in, gel such as silicon is put into the frame 190.

As shown in FIG. 3, for example, the upper arm 100UH of the phase U is composed of semiconductor switching devices SWUH1, SWUH2, SWUH3, and SWUH4 of the upper arm of the phase U composed of 4 IGBTs and diodes DUH1, DUH2, DUH3, and DUH4 connected to the semiconductor switching devices in parallel.

Next, by referring to FIG. 5, the mounting structure of each arm of the power module 100 of this embodiment will be explained. FIG. 5 is a perspective view of the arm 100UH which is selected as a representative of the six arms to explain the structure thereof. The upper arm 100UH of the phase U will be explained as a representative example, though the mounting structure of the other arms is similar.

The upper arm 100UH has the four semiconductor switching devices SWUH1, SWUH2, SWUH3, and SWUH4. The switching devices SWUH are respectively a chip of an IGBT device of, for example, 12 mm×12 mm with a thickness of 550 μm. An insulating substrate 180 is made of aluminum nitride and has a structure that the bottom thereof is cooled by water or air. On the insulating substrate 180, a copper wire 182 with a thickness of 0.3 mm is formed as a layer. On the surface (the upper surface drawn) of the copper wire 182, a nickel deposit film is formed. One electrode of each switching device SWUH is fixed to the copper wire 182 by solder 184 made of tin and lead having a melting point of about 330° C. The copper wire is electrically connected to the terminal TUHC. In this embodiment, the bottom of each of the chips of the switching devices SWUH1 to SWUH4 is a collector electrode and the top thereof is an emitter electrode. However, it is possible to attach the chips upside down so as to put the emitters on the lower side and the collectors on the upper side.

In the examples shown in FIGS. 4 and 5, the collectors are arranged on the lower side of the silicon chips, so that the collector electrodes of the four switching electrodes are arranged and connected in parallel on the wiring layer which is the copper wire 182 used in common. The copper wire 182 is electrically connected to the collector terminals TUHC of the upper arm of the phase U inside the frame 190 made of resin. Further, to the copper wire 182, the four diodes DUH1, DUH2, DUH3, and DUH4 constituting the upper arm 100UH are arranged and connected in parallel. Here, the diodes DUH1, DUH2, DUH3, and DUH4 are respectively a chip in a size of 5 mm×5 mm×0.4 mm (t) and the cathode pole (negative electrode) of each diode is installed on the side of the copper wire 182. When the silicon chips of the switching devices are fixed to the wiring layer in the opposite direction, that is, when the emitters are put and connected on the side of the copper wire 182, the diodes are respectively arranged and connected so that the anode pole (positive electrode) of each diode is installed on the side of the copper wire 182.

In this structure, the semiconductor switching devices connected to the copper wire 182, which is a common distributing board, in parallel are fixed respectively, thus the wiring operation can be performed easily. Further, on the copper wire 182 which is a common distributing board, the semiconductor switching devices connected in parallel are installed, so that the wiring layer naturally increases in size, and the inductance and electrical resistance can be reduced, or extreme polarization of the current of each device is prevented, as a result, local concentration of heat can be suppressed, that is, the radiating area for radiating heat via the insulating substrate 180 is increased, and the temperature can be made uniform. The wiring layer is increased in size, so that it becomes strong mechanically. The diodes connected in parallel are installed on the distributing board, so that the structure is simple and the diode chips can be attached easily. In this embodiment, the diodes are installed respectively in correspondence to the switching devices, though at least one diode may be installed such that one diode is installed for two switching devices. In consideration of insurance of safety, if at least two diodes are installed, even if one diode is damaged, it can operate continuously and the safety is improved more.

On the insulating substrate 180, a laminal (a layer is acceptable) conductor 186 is fixed. The laminal conductor 186 is electrically connected to the emitter terminal TUHE of the upper arm of the phase U in the frame 190 made of resin. An emitter electrode EE, the anode poles (positive electrodes) of the diodes DUH1 to DUH4, and the conductor 186 respectively installed on the top of the switching devices SWUH1 to SWUH4 connected in parallel are connected by the lead-shaped conductor LC. The lead-shaped conductor LC, as shown in the drawing, is a laminal conductor, is cut off beforehand in accordance with the switching devices SWUH1 to SWUH4, the diodes DUH1 to DUH4, and the position and height of the connection terminals, is bent by a press, and has a bent part LC-C in the middle of it. In this embodiment, in the lead-shaped conductor LC, the connection side with the conductor 186 is formed integrally and the connection side with the four switching devices SWUH is divided at its front end in correspondence with each of the switching devices SWUH, and is individually connected to the switching devices SWUH1, SWUH2, SWUH3, and SWUH4 at each divided front end. As described later, on the bottom side of a terminal 170 of the lead-shaped conductor LC, many projections are formed beforehand. The projections of the terminal 170 is composed of solder made of tin, silver, and copper having a melting point of about 230° C. By fusion of the solder, the emitter electrodes installed on the top of the switching devices SWUH, the upper electrodes of the diodes DUH, and the conductor 186 are connected by the laminal lead-shaped conductor LC.

The above explanation of the arm 100UH shown in FIG. 4 may be applied to the other arms 100UL, 100VH, 100VL, 100WH, and 100WL. To the common electrode 182 (not drawn) of the arm 100VH, the collector side of the four semiconductor switching devices is fixed and the common electrode 182 (not drawn) is electrically connected to the terminals TVHC. Further, the common electrode 186 (not drawn) of the arm 100VH is electrically connected to the emitter side of the semiconductor switching devices of the arm 100VH by the lead-shaped conductor LC which is a laminal conductor and connected to the terminals TVHE. Similarly, to the common electrode 182 (not drawn) of the arm 100WH, the collector side of the four semiconductor switching devices is fixed and the common electrode 182 (not drawn) is electrically connected to the terminals TWHC. Further, the common electrode 186 (not drawn) of the arm 100WH is electrically connected to the emitter side of the semiconductor switching devices of the arm 100WH by the lead-shaped conductor LC which is a laminal conductor and connected to the terminals TWHE. Further, the laminal conductor aforementioned may be a conductor layer installed on the insulating substrate.

To the common electrode 182 (not drawn) of the arm 100UL, the collector side of the four semiconductor switching devices is fixed and the common electrode 182 (not drawn) is electrically connected respectively to two terminals TULC1 and TULC2. Further, the common electrode 186 of the arm module 100UL is electrically connected to the emitter side of the semiconductor switching devices of the arm module 100UL by the lead-shaped conductor LC which is a laminal conductor and connected to the terminals TULE.

To the common electrode 182 (not drawn) of the arm 100VL, the collector side of the four semiconductor switching devices is fixed and the common electrode 182 (not drawn) is electrically connected respectively to two terminals TVLC1 and TVLC2. Further, the common electrode 186 (not drawn) of the arm module 100VL is electrically connected to the emitter side of the semiconductor switching devices of the arm module 100VL by the lead-shaped conductor LC which is a laminal conductor and connected to the terminals TVLE.

Furthermore, to the common electrode 182 (not drawn) of the arm 100WL, the collector side of the four semiconductor switching devices is fixed and the common electrode 182 (not drawn) is electrically connected respectively to two terminals TWLC1 and TWLC2. Further, the common electrode 186 (not drawn) of the arm 100WL is electrically connected to the emitter side of the semiconductor switching devices of the arm 100WL by the lead-shaped conductor LC which is a laminal conductor and connected to the terminals TWLE.

In the embodiment shown in FIGS. 4 and 5, the semiconductor chips connected in parallel are attached to the laminal conductor 182, and the terminals of the semiconductor chips connected in parallel in the opposite direction are connected by the common laminal conductor, so that the embodiment has a structure resistant to vibration and is superior in loading in a car of strong vibration. Furthermore, wire bonding is not necessary and the embodiment is manufactured easily. Further, compared with wire bonding, current concentration can be prevented, thus concentration of heat stress by a large current can be improved.

Gate electrodes EG installed on the top of the switching devices SWUH and gate terminal electrodes TG installed on the insulating substrate 180 are connected by bonding wires BW. The four gate terminal electrodes TG are respectively connected to gate terminals TUHG1, TUHG2, TUHG3, and TUHG4 of the upper arm of the phase U shown in FIG. 4.

Under the insulating substrate 180, a radiating plate composed of a heat conductive member such as copper is fixed. The radiating plate makes contact with a cooling medium such as cooling water and can radiate heat generated from the switching devices SWUH.

The wiring condition of the power module 100 will be explained by referring to FIG. 6. FIG. 6 shows a distributing board, and the distributing board is arranged so as to cover the top of the frame shown in FIGS. 4 and 5, thus the arm terminals TUHC, TVHC, and TWHC shown in FIGS. 4 and 5 are structured so as to go through the holes made in a wire LH composed of a copper plate, and the wire LH and the terminals aforementioned are connected by welding. Further, to protect the circuit parts shown in FIGS. 5 and 6, moisture-proof gel is put in the frame 190 and the top of the frame 190 is closed by the distributing board shown in FIG. 6.

The wire LH is connected to a positive terminal which is a connector. Further, in a wire LL made of a copper plate, similarly to the wire LH, holes are made. When the distributing board shown in FIG. 6 is arranged on the module shown in FIG. 4, the front ends of the three terminals TULE, TVLE, and TWLE are respectively projected from the holes. The projected terminals and the wire LL are connected by welding, thus they are connected electrically. The wire LL is connected to a negative terminal. The positive terminal and negative terminal are connected to the positive terminal and negative terminal of the DC power source.

Figure 6:
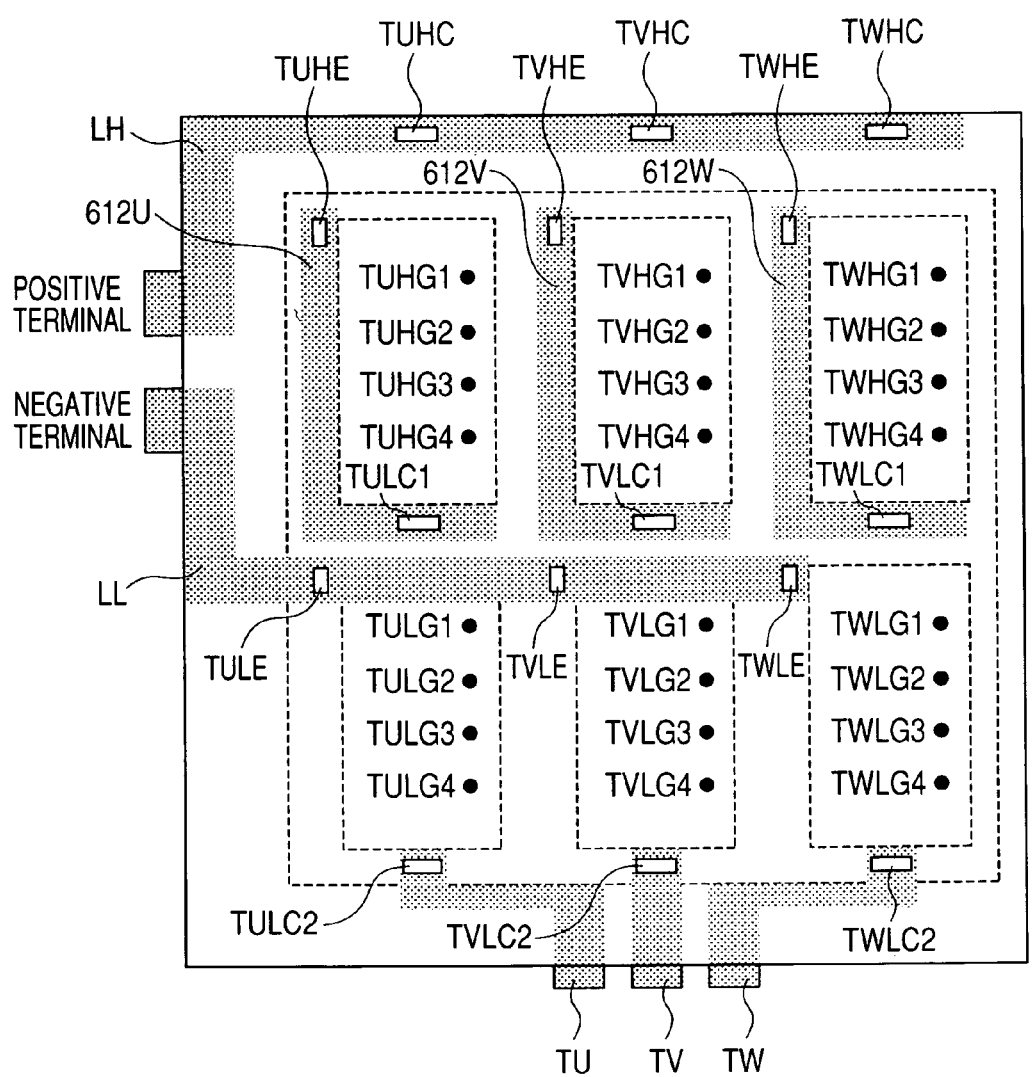
FIG. 6 is a wiring condition diagram of the power module of the first embodiment of the present invention.

On the distributing board shown in FIG. 6, wires 612U, 612V, and 612W made of copper are installed, and in the laminal wire 612U, the front ends of terminals TUHE and TULC1 are projected through two holes and the front ends and the wire 612U are fixed by welding. Similarly, from the holes of the wires 612V and 612W, the front ends of terminals TVHE and TVLC1 or the front ends of terminals TWHE and TWLC1 are respectively projected and fixed by welding. In FIG. 6, the terminals TULC1 and TULC2, TVLC1 and TVLC2, and TWLC1 and TWLC2 are respectively connected electrically by the common electrode 182 explained in FIG. 5 and the terminals TULC2, TVLC2, and TWLC2 are electrically connected to the terminals TU, TV, and TW. The terminals TU, TV, and TW are fixed to the distributing board and from these terminals, three-phase AC power which is output of the inverter is supplied to the motor 300.

Figure 7:
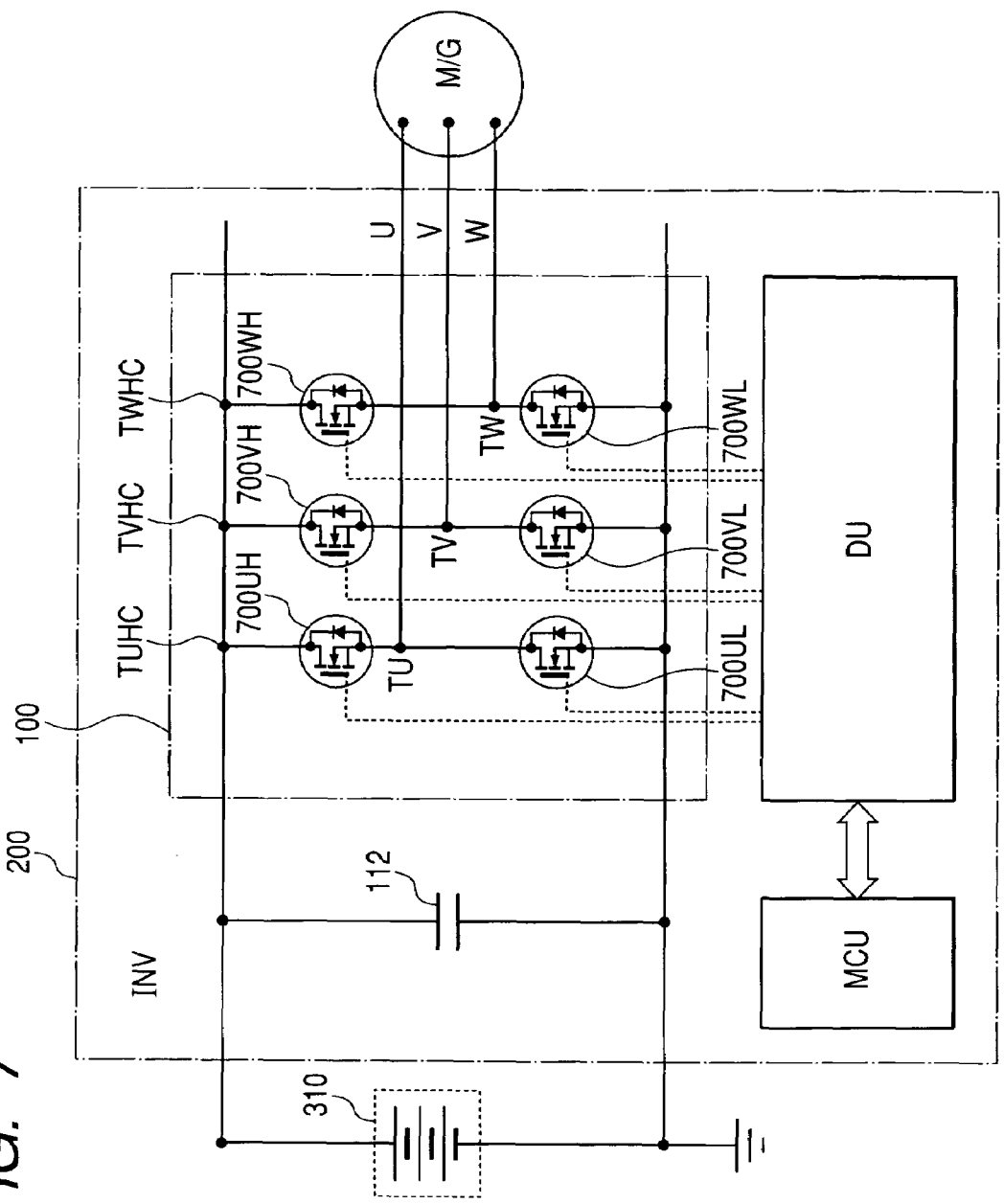
FIG. 7 is a circuit diagram of another constitution of the inverter including the power module of the first embodiment of the present invention.
Figure 8:
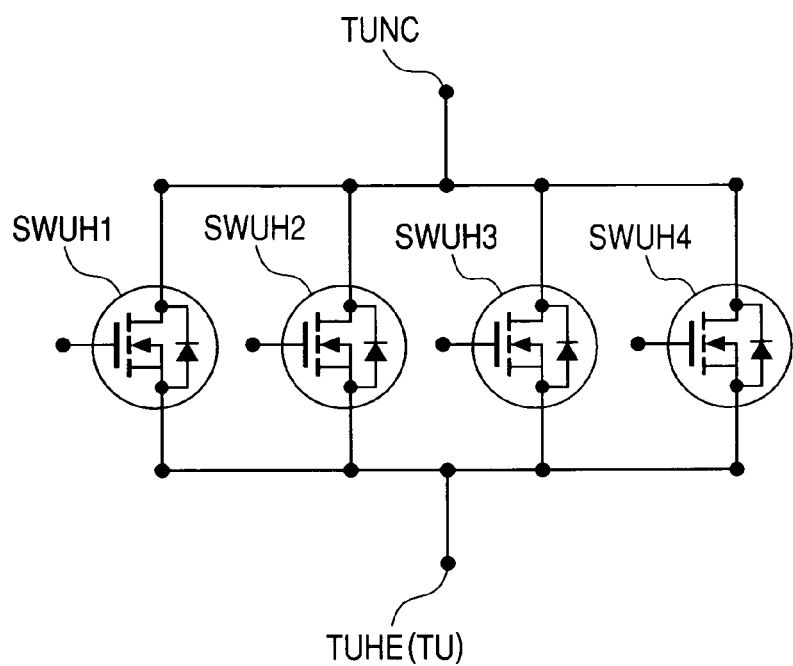
FIG. 8 is a detailed circuit diagram of another constitution of the inverter including the power module of the first embodiment of the present invention.

FIG. 7 is an alternative plan of FIG. 2, and FIG. 2 uses IGBTs as switching devices constituting the power module 100, while FIG. 7 uses power MOS-FETs (metal oxide semiconductor-field effect transistor). The same numbers as those shown in FIG. 2 have the same functions and perform the same operations. The power module 100 is composed of arms 700UH, 700UL, 700VH, 700VL, 700WH, and 700WL performing the same operations as those of the arms 100UH, 100UL, 100VH, 100VL, 100WH, and 100WL shown in FIG. 2. These arms, as shown in FIG. 8, are composed of a parallel circuit of SWUH1 to SWUH2 which are a plurality of power MOS-FETs. The switching devices connected in parallel may be considered to be the same as the IGBTs explained previously and these chips have the same structure as that explained in FIGS. 4 and 5, are fixed to the frame, and are wired. The difference from the IGBTs is that the IGBTs require diodes, while the power MOS-FETs do not require them. The reason is that the chips themselves of the power MOS-FETs already have the function fulfilled by the diodes.

Figure 9:
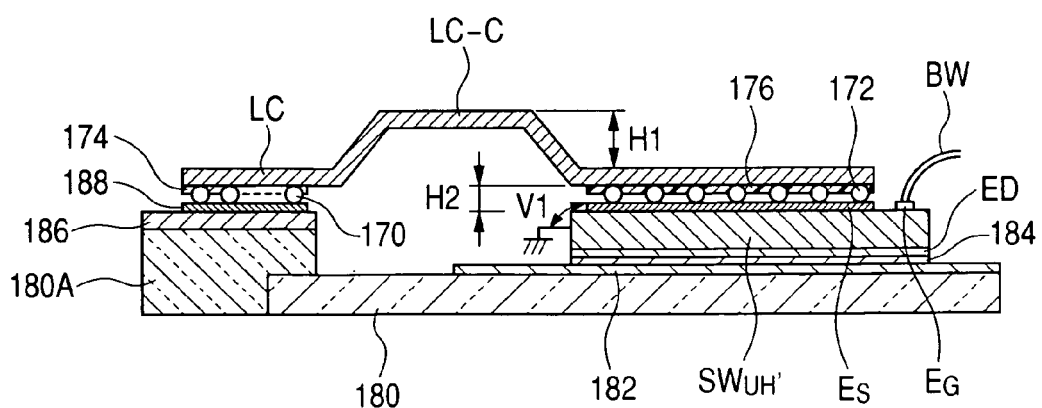
FIG. 9 is a cross sectional view showing the connection structure of the lead-shaped conductor LC with the interval between the emitter electrode on the top of the switching device SWUH of the power module of the first embodiment of the present invention and the conductor 186.

By referring to FIG. 9, the connection structure of the interval between the emitter electrodes which are top electrodes of the switching devices SWUH used in the power module and the conductor 186 with the lead-shaped conductor LC will be explained. FIG. 9 is a cross sectional view of the line A-A shown in FIG. 5 showing the connection structure of the interval between the emitter electrodes on the top of the switching devices SWUH constituting the power module shown in FIG. 5 and the conductor 186 with the lead-shaped conductor LC. Further, the same numerals as those shown in the other drawings indicate the same parts.

On the insulating substrate 180 made of ceramics, a layer of the copper wire 182 is formed. On the surface (the upper face in the drawing) of the copper wire 182, a nickel deposit film is formed. The collector electrode ED formed on the bottom of the switching device SWUH is fixed to the copper wire 182 by the solder 184 made of tin and lead having a melting point of about 330° C. Furthermore, on an insulating substrate 180A made of ceramics, a layer of the conductor 186 is formed. On the surface of the conductor 186, a gold deposit film 188 is formed. Further, in the drawing, the insulating substrate 180A with a different thickness is installed separately from the insulating substrate 180, and on the insulating substrate 180A, the conductor 186 is formed as a layer, and this is a structure that the height of the conductor 186 is made almost equal to the height of the upper electrode of the chip of the switching device SWUH. As another method, the insulating substrate 180A is not installed particularly and on the extension of the insulating substrate 180, the conductor 186 may be formed. In this case, the terminals 174 and 176 of the conductor LC are different in height and the connection is complicated slightly. However, the heat resistance for conducting generated heat of the switching devices via the conductor LC and the conductor 186 is reduced and an effect of suppressing a temperature rise of the devices is obtained.

The lead-shaped conductor LC is a copper plate with a thickness of 0.3 to 0.6 mm whose surface is plated with nickel. The part of the lead-shaped conductor LC positioned on the switching device SWUH has a width of about 15 mm which is almost equal to the width of the switching device SWUH. The lead-shaped conductor LC between the switching device SWUH and the conductor 186 has a bent part LC-C formed to absorb stress. The height H1 of the bent part LC-C is 3 to 7 mm. The bent part LC-C functions as a stress reduction unit (stress easing unit) for preventing the connection of the top of the switching device SW from concentration of stress, separation, and cracking due to differences in the coefficient of linear expansion between the units. When stress is generated due to differences in the coefficient of linear expansion, the bent part LC-C is deformed and can ease the stress.

At both ends of the lead-shaped conductor LC, terminals 170 and 172 for connection are formed. The terminals 170 and 172 have connection faces on the bottoms thereof. The connection faces have many projections installed. The projections are formed as indicated below. On the bottoms which are the connection faces of the terminals of the lead-shaped conductor LC, solder resist layers 174 and 176 made of epoxy resin as a main component are formed with a thickness of about 30 to 100 μm. In the solder resist layers 174 and 176, openings with a diameter of 500 μm are formed by photo resist in correspondence with the projections of the connection faces of the terminals 170 and 174. From the openings, on the connection faces of the conductor LC, gold deposit films are formed. Furthermore, to the gold deposit films, solder made of tin, silver, and copper with a melting point of about 230° C. is attached as a solder ball with a diameter of 500 μm. Assuming the dimensions of the emitter electrodes ES formed on the top of the switching devices SWUH as 12 mm×8 mm, on the connection faces of the terminals, 49 projections are formed in 7 rows and 7 columns. The number of projections of the terminals 170 is almost equal to the number of projections of the terminal 172.

To the conductor 186 and the emitter electrodes ES on the top of the switching devices SWUH, the lead-shaped LC is positioned, and the lead-shaped conductor LC is retained by a press jig made of carbon, and then these articles are put into a heating oven in an environment higher than the melting point of the solder material used for the terminals 170 and 172. By doing this, to the conductor 186 and the emitter electrodes ES on the top of the switching devices SWUH, the lead-shaped conductor LC can be fixed.

Further, in addition to the aforementioned projections, when solder balls with a diameter of 500 μm are used, a gap H2 between the bottoms of the terminals of the lead-shaped conductor LC and the top of the switching devices SWUH can be set to 500 μm or more. The switching devices SWUH are structured so as to have dielectric strength for preventing dielectric breakdown even if a predetermined voltage V1 (assuming the normal maximum voltage of the switching devices SWUH as 600 V, the voltage V1 is 1200 V of two times) is applied between the position of the earth potential (the collector potential in this case) of the end face thereof and the emitter electrodes ES on the top. When the gap H2 between the bottom of the lead-shaped conductor LC and the top of the switching devices SWUH is set to 500 μm or more in this structure, the dielectric strength between the bottom of the lead-shaped conductor LC and the top of the switching devices SWUH can be prevented from reduction.

Further, as a material of the terminals 170 and 172, tin or an alloy of tin compounded with a metal such as copper, silver, zinc, or nickel can be used. Furthermore, when forming projections by any of these connection materials, to keep the wetting extent amount of the connection material to the lead-shaped conductor constant and prevent the connection material from extending overall the lead-shaped conductor, a layer made of epoxy resin or polyimide resin is formed on the lead-shaped conductor on the device connection side, and projections are formed by a junction material keeping the height almost constant. Furthermore, when the material of the device electrodes is gold, as a connection material forming the projection-shaped connections, tin can be used. In addition, as a connection material, indium, bismuth, zinc, antimony, silver, tin, or copper can be used individually or an alloy compounded with 2 or more kinds can be used.

As described above, it is necessary to keep the dielectric strength between the conductor LC and the device chips. As described above, assuming the DC voltage supplied to the inverter as 600 V, the dielectric strength of two times thereof is necessary. In FIG. 9, by the projection installed on the connection face of the terminal of the conductor LC on the device side, the distance from the side of the chip can be kept. Furthermore, by use of not only the aforementioned projection but also a solder ball, the distance is increased more, thus the dielectric strength is increased. Furthermore, the connection face of the conductor LC is prepared so as to be installed in parallel with the electrode face of the device in accordance with the electrode thereof and when the connection face ends, is bent in the direction separating from the device. The bending not only absorbs the stress but also performs an important operation to keep the dielectric strength. Therefore, it is desirable to start the bending from the end of the chip or from the inside of the end.

With respect to the conductor LC, the device side thereof is divided in correspondence to the devices and the side of the conductor 186 is not divided, though it may be divided for each device. When the conductor LC is divided for each device, it can be positioned for each device. However, the number of parts is increased, so that the operation man-hour is increased. When the conductor is divided for each two devices, the displacement can be adjusted easily and the number of parts can be controlled not to increase so much.

FIG. 9 explains the structure of the connection of the switching devices used in the switching module 100 with the lead-shaped conductor LC using the device SWUH1 as a representative example. The same may be said with the other devices constituting the arm 100UH and furthermore, the devices of the other arms have the same structure.

Figure 10:
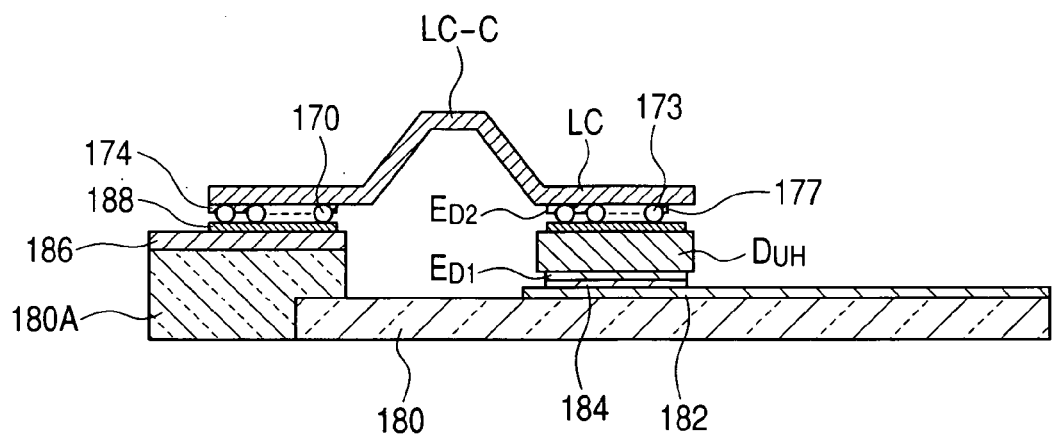
FIG. 10 is a cross sectional view showing the connection structure of the lead-shaped conductor LC with the interval between the emitter electrode on the top of the diode DUH of the power module of the first embodiment of the present invention and the conductor 186.

Next, by referring to FIG. 10, the connection structure of the interval between the top electrodes of the diodes DUH of the power module 100 and the conductor 186 with the lead-shaped conductor LC will be explained. FIG. 10 is a cross sectional view showing the connection structure of the interval between the emitter electrodes on the top of the diodes DUH used in the power module 100 and the conductor 186 with the lead-shaped conductor LC. FIG. 10 shows a cross section of the line B-B shown in FIG. 5. Further, the same numerals as those shown in the other drawings indicate the same parts.

The basic constitution and operation shown in FIG. 10 are the same as those shown in FIG. 9. On the insulating substrate 180 made of ceramics, the copper wire 182 is formed. On the surface (the upper surface shown in the drawing) of the copper wire 182, a nickel deposit film is formed. The electrode ED1 formed on the bottom of the diode DUH is fixed to the copper wire 182 by the solder 184 made of tin and lead having a melting point of about 330° C. Furthermore, the conductor 186 electrically connected to the anode electrode of the diode is installed on the insulating material 180A made of ceramics.

On the bottom which is a connection face of the terminals 170 and 173 of the conductor LC, a projection is formed beforehand. To the conductor 186 and the electrode (cathode pole) ED2 on the top of the diode DUH, the lead-shaped conductor LC is positioned, and the lead-shaped conductor LC is retained by a press jig made of carbon, and then these articles are put into a heating oven in an environment higher than the melting point of the solder material used for the terminals 170 and 173. By doing this, to the conductor 186 and the electrode ED2 on the top of the diode DUH, the lead-shaped conductor LC can be fixed.

As explained above, when the lead-shaped conductor LC is used, in consideration of one arm module, 4 pairs of switching devices and a pair of diodes can be connected at a time and the workability is improved. Further, when the sectional area of the connection of other than a control signal input to the gate terminal of the semiconductor switching device SW is made wider than that when bonding wires are used, it is suited to an inverter supplying a large current like an inverter for a car. Further, the conductor can supply heat and in this respect, can obtain good results under severe use condition like a car.

Further, in the above explanation, an IGBT is used as a semiconductor switching device. When a MOS-FET is used as a semiconductor switching device, no diode is necessary. Also in this case, when the top electrode of a single MOS-FET and conductor are connected by the lead-shaped conductor or one arm module is composed of a plurality of MOSFETs, the top electrodes can be connected at a time by one lead-shaped conductor.

Further, in the above explanation, solder having a melting point of 230° C. is used for the projection terminals 170 and 172 and solder having a melting point of 330° C. is used as solder 184. However, when the two use a material having almost the same melting point, the top and bottom of the switching device SW1 can be connected at the same time and moreover the workability can be improved. At this time, as solder 184, solder in a sheet form is used. Further, as a solder material, solder having a low melting point such as 180° C. can be used.

As explained above, according to this embodiment, by use of the lead-shaped conductor, a large current can be generated, and the assembly capacity can be improved, and it is suited to the structure of an inverter for generating power for motor drive by a power source loaded in a car. Namely, even if the current capacity of a single switching device is increased or even if the number of pairs of switching devices and diodes is increased, the assembly capacity is not impaired, and furthermore, when the sectional area of the joined part is increased, fusion when a large current is supplied is prevented, and the reliability can be improved. Even if a highly reliable arm is formed by a parallel structure of switching devices, the workability can be prevented from reduction.

Further, by use of a projection-shaped electrode realizing batch connection at the joined part of the lead-shaped conductor with each element of switching devices, diodes, and conductors, compared with the conventional case using bonding wires, the sectional area of the connections can be increased, and the connections can respond to an increase in the current amount, and the assembly capacity is improved. The contact area of each switching device electrode with a wire can be made larger than that of wire bonding, so that voltage drop at the contact part can be reduced, and in an inverter used in a motor in which there is an operation condition at a high rotational speed of the motor at a comparatively low supply voltage like a mobile device, a problem of insufficiency in the terminal voltage of the motor in correspondence to an increase in the induced voltage of the motor due to the high rotational speed and insufficiency in the supply current in correspondence to it can be improved.

Furthermore, when the current amount is increased and for a single arm, a pair of a plurality of switching devices and diodes is used, if a lead-shaped conductive material is connected, the pair of switching devices and diodes can be connected in a batch unless connected individually, so that the correspondence of the apparatus to a large current and the simplification of assembly can be realized at the same time.

As mentioned above, by use of the lead-shaped conductor, compared with a case that bonding wires are used, the connection sectional area can be spread greatly and the current amount for controlling the devices and terminals can be increased greatly. Furthermore, when using the pair of a plurality of switching devices and diodes, if a lead-shaped conductive material is connected, the switching devices and diodes can be connected to the terminals of the case at the same time, and even if the current amount is increased and the pair of switching devices and diodes is increased, they can be assembled in a batch, so that the assembly capacity is improved.

Further, by connecting by the conductor 186 and the lead-shaped conductor for integrating the switching devices SW and diodes D, the inductance of the connection member can be reduced. Further, the thermal conduction from the semiconductor switching devices SW can be made more uniform, so that between the semiconductor switching devices SW connected in parallel, a temperature difference is hardly generated, thus the reliability is improved. Further, the semiconductor switching devices SW are connected integrally by the lead-shaped conductor, so that the potential applied to each of the semiconductor switching devices SW can be made uniform. The potential can be made uniform and the thermal conduction can be made uniform, so that variations due to changing with time can be reduced.

Further, by use of the integrated lead-shaped conductor, the resonance is suppressed and the vibration resistance can be improved.

Next, by referring to FIG. 11, the constitution of the power module of the second embodiment of the present invention will be explained. In this example, the power module is used in an inverter of a three-phase AC motor drive unit. The external constitution of the power module of this embodiment is the same as that shown in FIG. 4. Further, the circuit diagram of the power module of this embodiment is the same as that shown in FIGS. 2 and 3.

Figure 11:
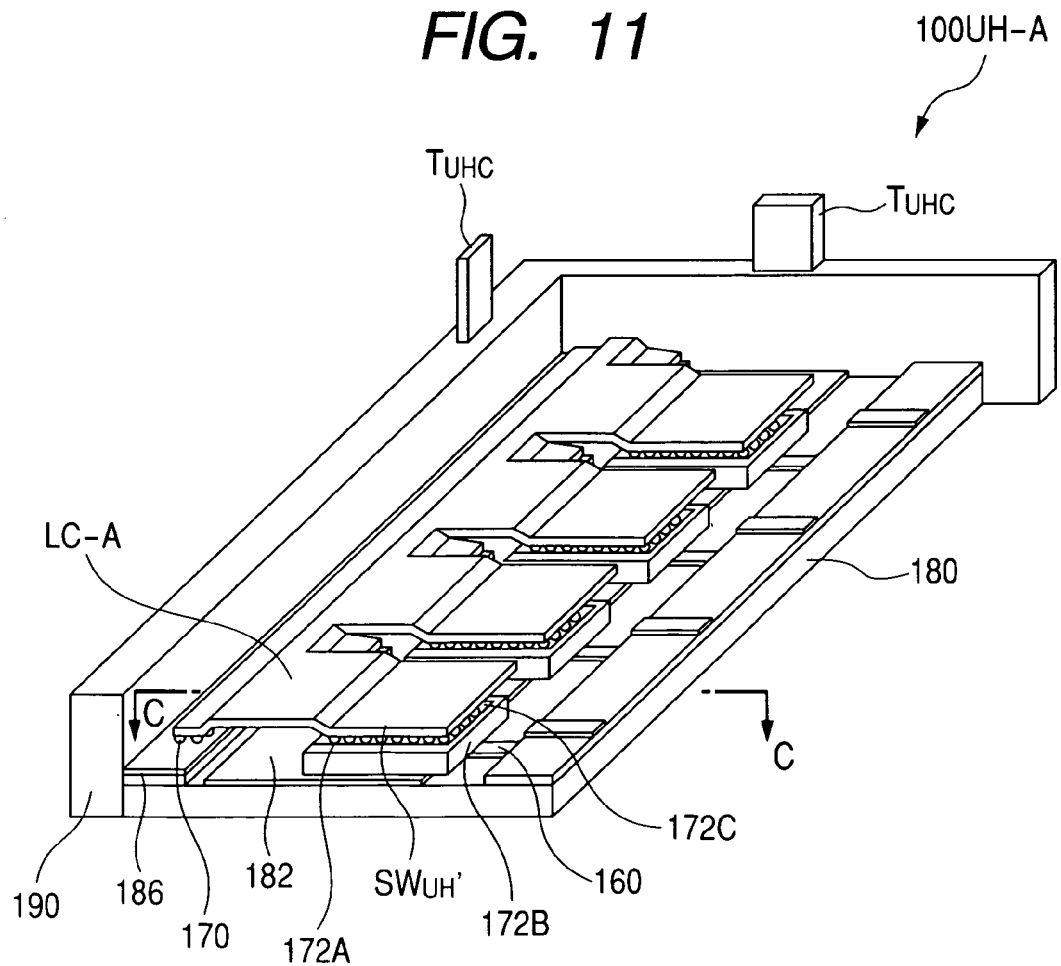
FIG. 11 is an enlarged perspective view showing the constitution of the arm module of the power module of the second embodiment of the present invention.

FIG. 11 is an enlarged view of the arm constitution of the power module of this embodiment. Here, an example of the module 100UH of the upper arm of the phase U will be explained, though the module constitutions of the other arms are the same. Further, the same numerals as those shown in the other drawings indicate the same parts.

In the arm 100UH-A, the switching device SWUH' is arranged upside down for that shown in FIG. 5. Therefore, on the top side, the collector electrodes are positioned and on the bottom side, the emitter electrodes and gate electrodes are positioned.

The emitter electrode on the bottom side of the switching device SWUH' is connected to the wire 182 installed on the insulating substrate 180 by a solder bump 172A. Furthermore, the gate terminal of the switching device SWUH' is connected to the wire 160 installed on the insulating substrate 180 via a solder bump 172B. The wire is connected to the gate terminal TUHG shown in FIG. 2. The collector electrode on the top side of the switching device is connected to the lead-shaped conductor LC-A by a terminal similarly having a projection and a solder bump 172C serving as a junction material. The lead-shaped conductor, terminal projection, and solder bump serving as a junction material can use those shown in FIG. 5.

In this embodiment, for connection of the gate electrodes used to control the switching devices, terminals having projections and solder bumps are used. Four pairs of switching devices and a pair of diodes are connected at a time, and the sectional area of the connections of other than a control signal can be widened, and the connections can respond to an increase in the current amount.

Figure 12:
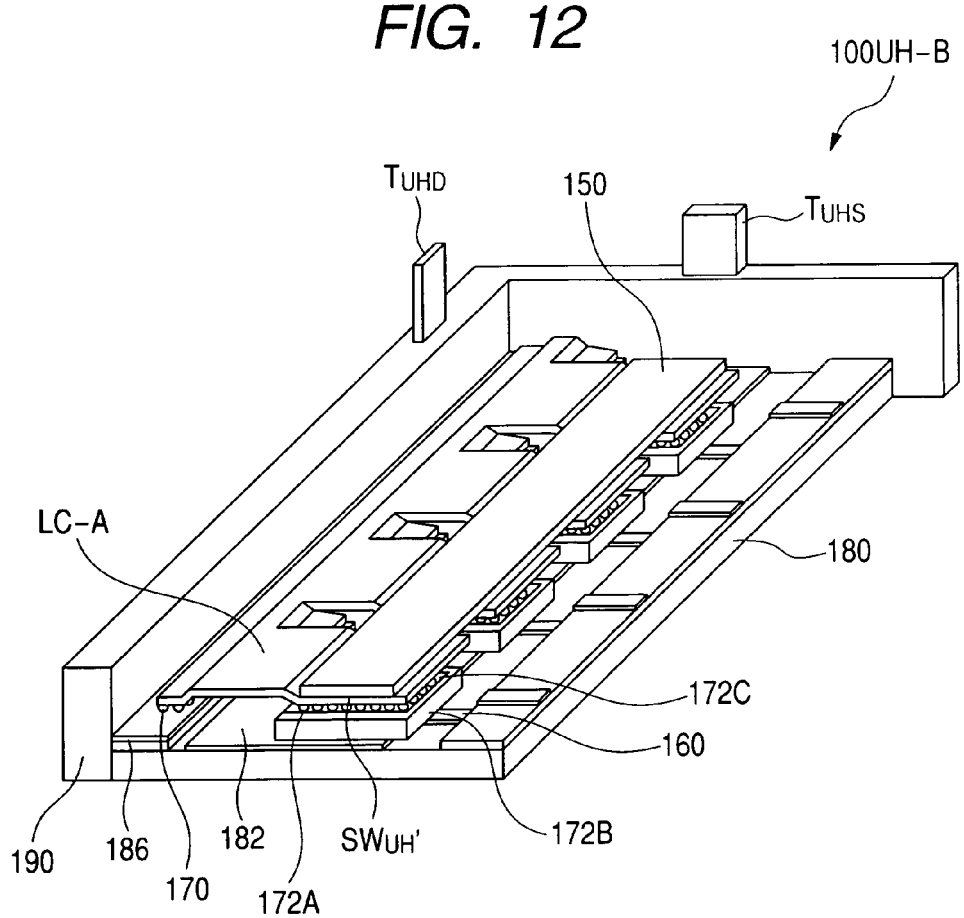
FIG. 12 is an enlarged perspective view showing the constitution of the arm module of the power module of the third embodiment of the present invention.

Next, by referring to FIG. 12, the constitution of the power module of the third embodiment of the present invention will be explained. In this example, the power module is used in an inverter of a three-phase AC motor drive unit. The external constitution of the power module of this embodiment is the same as that shown in FIG. 4. Further, the circuit diagram of the power module of this embodiment is the same as that shown in FIG. 2. FIG. 12 is an enlarged view of the arm module constitution of the power module of this embodiment. Here, an example of the module 100UH of the upper arm of the phase U will be explained, though the module constitutions of the other arms are the same. Further, the same numerals as those shown in the other drawings indicate the same parts.

In the arm module 100UH-B, the loading method of the switching device SWUH' onto the insulating substrate 180, the shape of the lead-shaped conductor LC-A, and the connection method of each electrode by the solder bumps 172A, 172B, and 172C are the same as those shown in FIG. 7.

In this embodiment, on the top of the lead-shaped conductor LC-A, an insulating base material 150 made of ceramics is connected. The composite thermal expansion coefficient of the lead-shaped conductor LC-A and the base material 150 is an intermediate value of the two, so that it can be made smaller than the thermal expansion coefficient of the single lead-shaped conductor LC-A, and the difference from the thermal expansion coefficient of the switching devices SWUH' can be made smaller, and the thermal strain generated in the joined parts with the switching devices SWUH' is reduced, and the reliability of the joined parts can be improved more.

Further, as a material of the base material 150, in addition to ceramics, alloys of low thermal expansion such as Invar composed of iron and nickel and Kovar composed of iron, nickel, and cobalt can be used.

Next, by referring to FIG. 13, the constitution of the power module of the fourth embodiment of the present invention will be explained. In this example, the power module is used in an inverter of a three-phase AC motor drive unit. The external constitution of the power module of this embodiment is the same as that shown in FIG. 4. Further, the circuit diagram of the power module of this embodiment is the same as that shown in FIG. 2.

Figure 13:
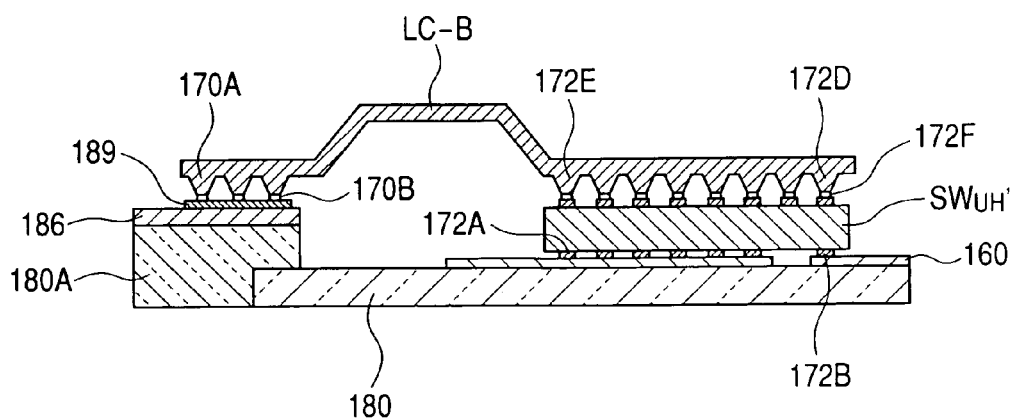
FIG. 13 is an enlarged perspective view showing the constitution of the arm module of the power module of the fourth embodiment of the present invention.

FIG. 13 is a cross sectional view of the arm module of the power module of the fourth embodiment of the present invention. The drawing shows the sectional structure equivalent to the section A-A shown in FIG. 5. Further, the same numerals as those shown in the other drawings indicate the same parts.

The lead-shaped conductor LC-B uses a core of copper and on the joined parts of the switching device SWUH' and the intra-case terminal 186, projections 172D and 170A integrally formed with the terminals of the lead-shaped conductor LC-B are formed. The projections 172D and 170A are formed by projection-processing the connection faces of the terminals of the lead-shaped conductor by pressing beforehand. Further, projections may be formed by removing unnecessary parts by etching or may be formed on a necessary part by plating. Furthermore, on the surfaces of the projections 172D and 170A, tin deposit films 172F and 170B are formed.

On the surfaces of the switching device SWUH' and the intra-case terminal 186, a bump 172E and a gold deposit film 189 by gilding are formed respectively. Tin deposit films 172F and 174B and a gold deposit film 189 or a gold bump 182E which are installed on the lead-shaped conductor LC-B are respectively put in the corresponding positions and are heated to 280° C. or higher while applying an appropriate load, thus the tin deposit films and gold deposit film or gold bump are reacted, and an alloy of gold and tin is formed, and the junction of the lead-shaped conductor LC-B, switching device SWUH', and intra-case terminal 186 is completed. Further, the diodes and lead-shaped conductor are also connected similarly.

The connection material formed at the connections of the projections and devices varies with the electrode material of the connections of the devices. When the electrode material is a nickel layer or a nickel layer whose surface is gilded, tin or an alloy of tin compounded with a metal such as copper, silver, zinc, or nickel can be used as a junction material.

Next, by referring to FIGS. 14 and 15, the constitution of the power module of the fifth embodiment of the present invention will be explained. In this example, the power module is used in an inverter of a three-phase AC motor drive unit. The external constitution of the power module of this embodiment is the same as that shown in FIG. 4. Further, the circuit diagram of the power module of this embodiment is the same as that shown in FIG. 2.

Figure 14:
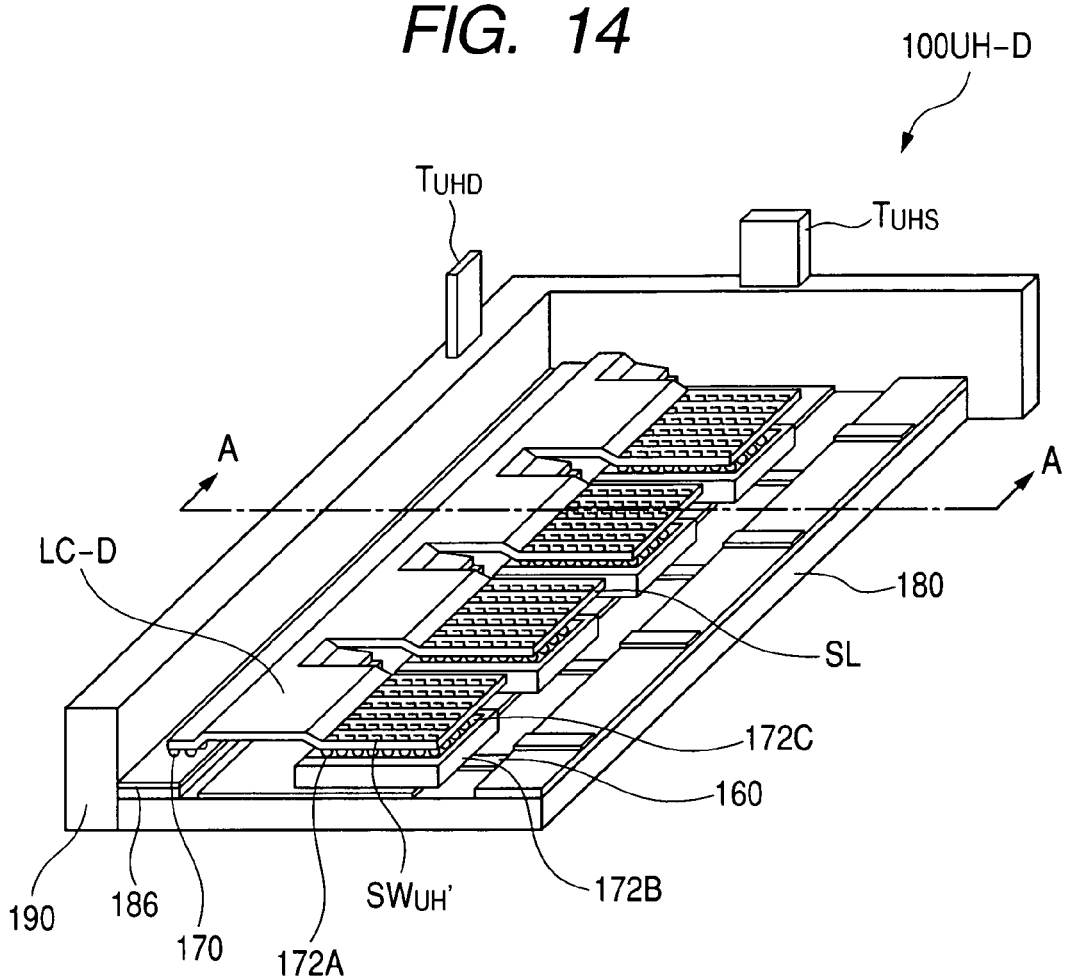
FIG. 14 is an enlarged perspective view showing the constitution of the arm module of the power module of the fifth embodiment of the present invention.

FIG. 14 is an enlarged view of the arm module constitution of the power module of this embodiment. Here, an example of the module 100UH of the upper arm of the phase U will be explained, though the module constitutions of the other arms are the same. FIG. 14 is an enlarged perspective view showing the arm module constitution of the power module of the fifth embodiment of the present invention. FIG. 15 is a cross sectional view of the line A-A shown in FIG. 14. Further, the same numerals as those shown in the other drawings indicate the same parts.

In the arm module 100UH-D of this example, the basic constitution is the same as that shown in FIG. 9. In this example, in the joined parts of the lead-shaped conductor LC-D' and the switching devices SWUH', slits SL are formed in the circumferences of the projection terminals 172D of the lead-shaped conductor LC-D' to separate the joined parts of the lead-shaped conductor with the devices. The slits SL have a U-shaped plane and as shown in FIG. 15, pass through the lead-shaped conductor LC-D'. Therefore, the projection terminals 172D are connected to the lead-shaped conductor LC-D' with only one side thereof, so that they are in an easily deformable shape. As a result, due to changes in the device operation and use environmental temperature, even if the dimensions of the devices and lead-shaped conductor and connection positions are changed, the lead-shaped conductor is easily deformed at the slits, and all the lead electrodes are prevented from strain, thus strains caused at the connections are reduced, and the reliability of the power module can be improved more.

Figure 15:
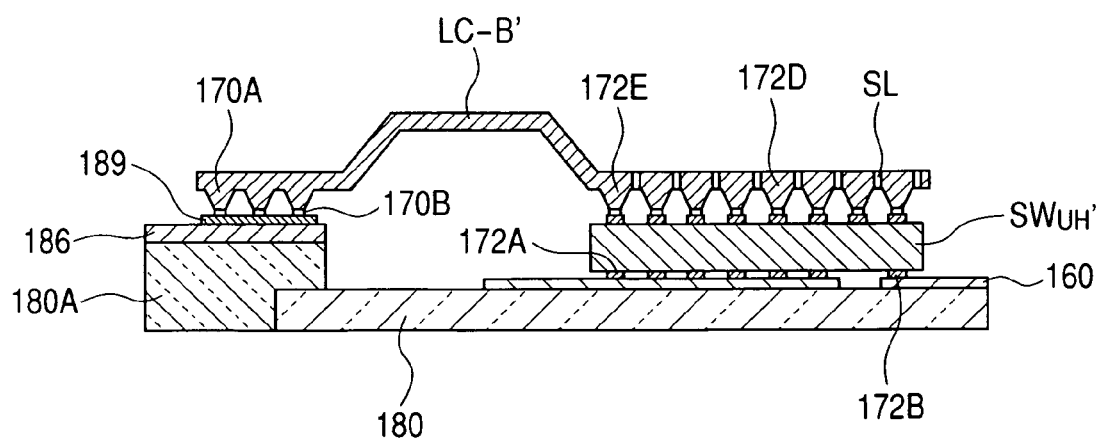
FIG. 15 is a cross sectional view of the line A-A shown in FIG. 14.

With respect to the connections of the conductor LC shown in FIGS. 13 and 15, the distance from the chip side is retained by the projections and the dielectric strength can be ensured. Furthermore, at the chip end or inside the end, the conductor LC is bent in the direction separating from the chip side. By doing this, the dielectric strength can be maintained.

Further, to the slits, to prevent them from large deformation when connecting the devices, polyimide films can be adhered to the back of the connection with each device. Furthermore, to enable the lead part slit due to temperature changes during the device operation to move easily, between the slit lead-shaped conductive material and the polyimide films, a relaxation layer made of resin with a coefficient of elasticity of 0.1 MPa to 100 MPa may be installed.

Further, the parts of the lead-shaped conductor other than the joined parts with the devices are reticulated, and strain caused between the device joined parts and the devices is relaxed, and the connections can be prevented from fusion due to an increase in the current amount.

In the embodiment aforementioned, the conductor LC is slit only on the device side thereof and is integral on the other side to reduce the number of parts. However, the opposite side of the device side may be slit completely for each two devices instead of integral. The positioning to the devices can be executed easily. Furthermore, the opposite side may be slit completely for each device.

To absorb stress, in addition to the aforementioned shape of the conductor LC, on the parts of LC-C and LC-B, a conical shape may be formed in the direction separating from the insulating substrate 180. Further, the thickness of the concerned parts may be made thinner so as to absorb stress easily. Compared with connection by wires, the width of the conductor LC can be ensured sufficiently, so that even if the conductor LC is thinned partially, there is no problem imposed in supply of a current.

What is claimed is:

1. An inverter on board of a vehicle for converting a direct current supplied from a direct current power source to an alternating current for driving a motor on board of said vehicle, wherein:

said inverter has a plurality of arms for conducting and cutting off the current and said each arm has a plurality of switching devices and a first and a second wiring layer for connecting said switching devices, the plurality of switching devices in said each arm are constituted so that they are connected in parallel electrically, said first and second wiring layers of said each arm are respectively formed on an insulating substrate and one face of said switching devices is fixed to said first wiring layer, said second wiring layer and the other faces of said switching devices are electrically connected by a laminal conductor, said laminal conductor is arranged ranging over said plurality of switching devices, and has first connecting portions fixed to the other faces of said switching devices and second connecting portion fixed to the second wiring layer, and said laminal conductor is equipped with slits which divide said first connecting portions for each of said switching devices.

2. An inverter according to claim 1, wherein:
said connection faces of said first and second connections of said laminal conductor and said other face of said switching device or said second wiring layer are connected by solder balls.

3. An inverter according to claim 1, wherein:
said first connection of said laminal conductor is fixed to said other face of said switching apparatus and said laminal conductor has a shape bent in the neighborhood of said second connection of said connection fixed to said other face in a direction separating from said first wiring layer to which said one face of said switching apparatus is fixed.

4. An inverter according to claim 1, wherein:
said inverter has a positive pole side wire and a negative pole side wire for supplying the direct current to said inverter from the direct current power source, the plurality of arms consist of phases U, V, and W for generating the alternating current of phases U, V, and W, the arms of phases U, V, and W are connected in parallel mutually between the positive pole side wire and the negative pole side wire, each arm of phases U, V, and W has an upper arm and a lower arm, respectively, each upper arm and each lower arm has the plurality of switching devices electrically connected in parallel, respectively, the switching devices are connected electrically in parallel between the first wiring layer and the second wiring layer, respectively, by connection that fixes the one face thereof to the first wiring layer and connects the other face thereof to the second wiring layer using the laminal conductor.

* * * * *